(12) United States Patent
Bauernfeind et al.

(10) Patent No.: US 7,573,348 B2
(45) Date of Patent: Aug. 11, 2009

(54) ARRANGEMENT AND METHOD FOR DETERMINING A GRADIENT FACTOR FOR A DIGITALLY CONTROLLED OSCILLATOR, AND PHASE LOCKED LOOP

(75) Inventors: Thomas Bauernfeind, Arbing (AT); Linus Maurer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 173 days.

(21) Appl. No.: 11/840,408

(22) Filed: Aug. 17, 2007

(65) Prior Publication Data
US 2008/0042753 A1 Feb. 21, 2008

(30) Foreign Application Priority Data
Aug. 18, 2006 (DE) ............ 10 2006 038 835

(51) Int. Cl.
H03C 3/06 (2006.01)
H03L 7/085 (2006.01)
(52) U.S. Cl. ............ 332/126; 331/1 A; 331/1 R; 331/16; 331/17; 331/23; 331/25; 332/127; 332/128; 375/376
(58) Field of Classification Search ......... 331/1 A, 331/1 R, 16, 17, 23, 25, DIG. 2; 332/127, 332/128; 375/376
See application file for complete search history.

(56) References Cited

U.S. PATENT DOCUMENTS 6,211,747 B1 4/2001 Trichet et al.
6,531,926 B1* 3/2003 Pate et al. ............ 331/17
6,933,798 B2* 8/2005 Hammes et al. ......... 332/127
2005/0232385 A1* 10/2005 Yoshikawa et al. ....... 375/376
2006/0033582 A1 2/2006 Staszewski et al.
2007/0018733 A1* 1/2007 Wang et al. ............ 331/16

OTHER PUBLICATIONS

"A 1 GHz ΣΔ Noise Shaper for All Digital PLLs with Multiband UMTS Modulation Capability", Thomas Mayer, Volker Neubauer, Ulrich Vollenbruch, Tindaro Pittorino, Linus Maurer and Andreas Springer, IEEE RFIC Symp. 2006, 5 pgs.
"Real-Time Parameter Estimation", Chapter 3, K.J. Aström et al., Addison-Wesley, Reading MA, 1989.
"Automatic Calibration of Modulated Frequency Synthesizers", Daniel R. McMahill and Charles G. Sodini, IEEE Transactions on Circuits and Systems—II; Analog and Digital signal Processing, vol. 49, No. 5, May 2002, pp. 301-311.

(Continued)

Primary Examiner—Joseph Chang
Assistant Examiner—Jeffrey Shin
(74) Attorney, Agent, or Firm—Eschweiler & Associates, LLC

(57) ABSTRACT

An arrangement for determining a gradient factor for a digitally controlled oscillator has a data alignment device and an identification device. The data alignment device can be supplied a modulation signal, a phase error signal and an oscillator control word. The data alignment device is configured to output a modulation setting word based on the modulation signal, output a time interval magnitude based on the phase error signal and a reference interval, and output an oscillator modulation word based on the oscillator control word. The identification device is configured to adapt and output the gradient factor based on the modulation setting word, the time interval magnitude and the oscillator modulation word.

25 Claims, 6 Drawing Sheets

OTHER PUBLICATIONS

"LMS-Based Calibration of an RF Digitally Controlled Oscillator for Mobile Phones", Robert Bogdan Staszewski, John Allberg, Chih-Ming Hung, Gennady Feygin, Mitch Entezari and Dirk Leipold, IEEE Transactions on Circuits and Systems—II; Express Briefs, vol. 53, No. 3, Mar. 2006, pp. 225-229.

"Just-In-Time Gain Estimation of an RF Digitally-Controlled Oscillator for Digital Direct Frequency Modulation", Robert B. Staszewski, Dirk Leipold and Poras T. Balsara, IEEE Transactions on Circuits and Systems—II; Analog and Digital Signal Processing, vol. 50, No. 11, Nov. 2003, pp. 887-892.

* cited by examiner

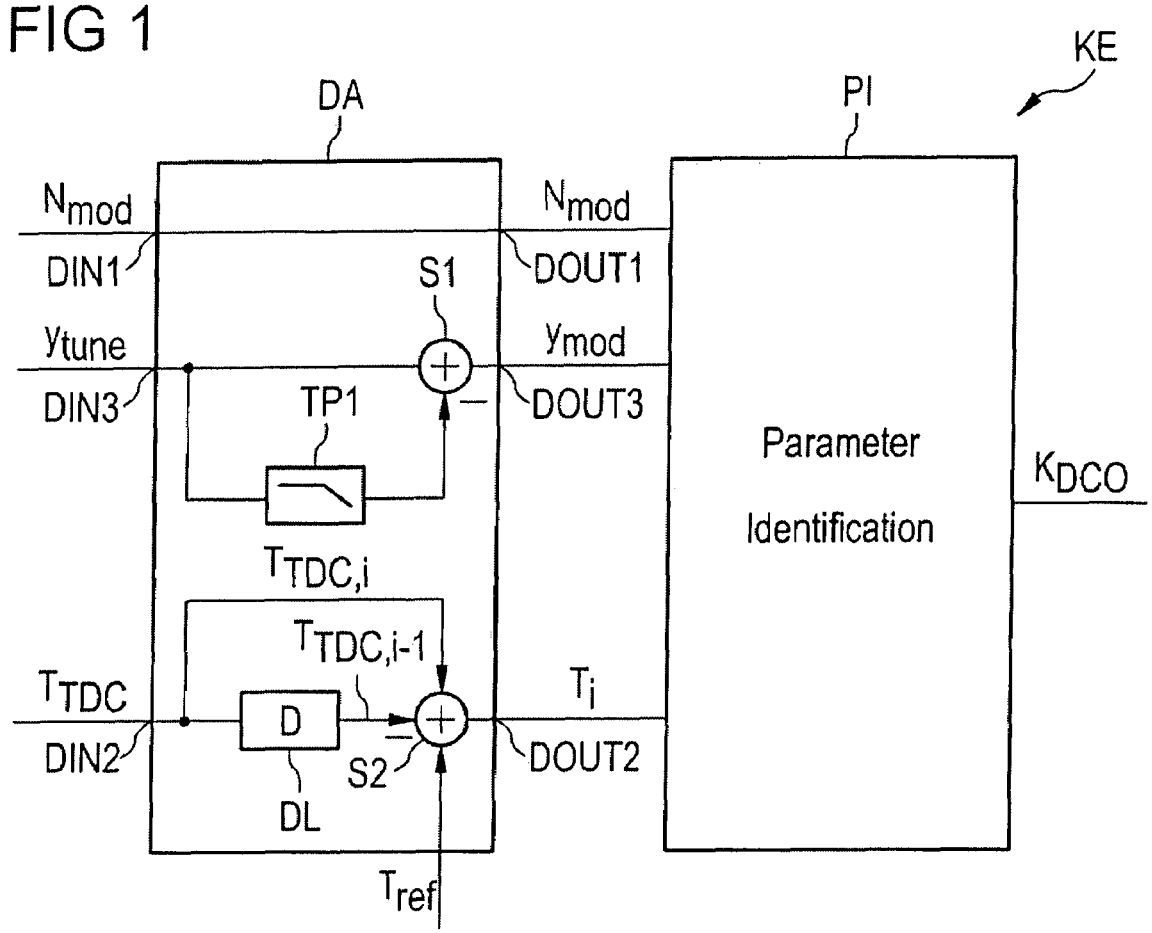

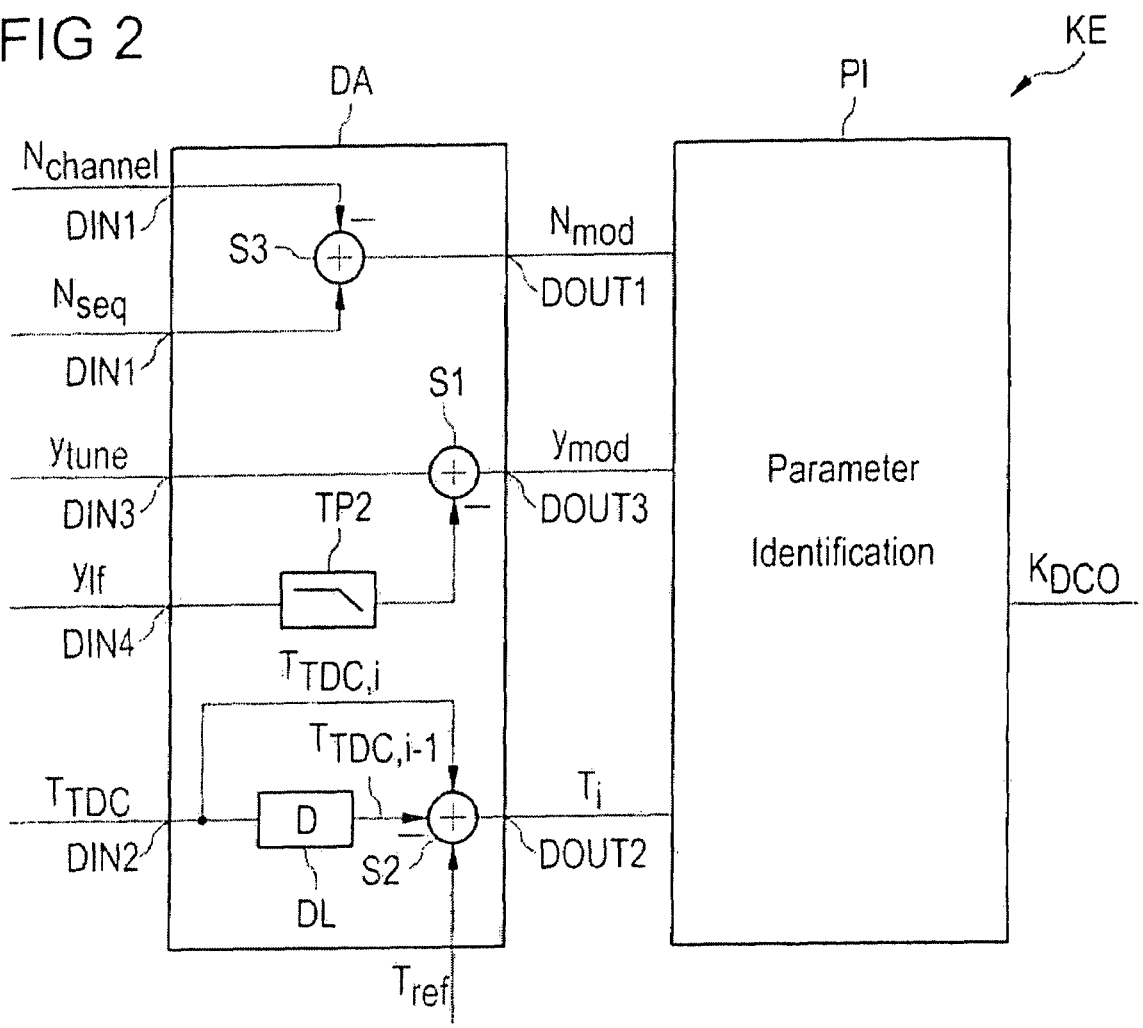
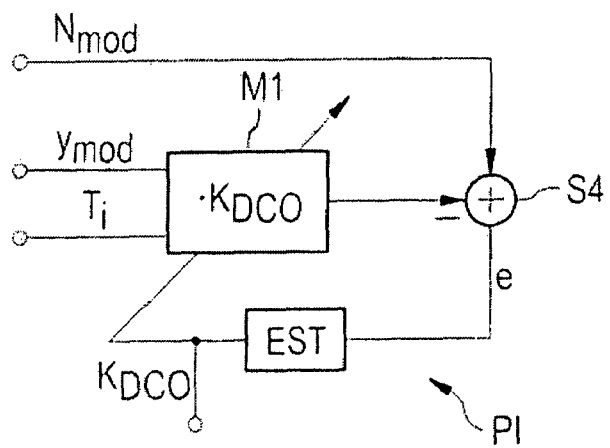

ARRANGEMENT AND METHOD FOR DETERMINING A GRADIENT FACTOR FOR A DIGITALLY CONTROLLED OSCILLATOR, AND PHASE LOCKED LOOP

FIELD OF THE INVENTION

The invention is directed to communications, and more particularly is directed to a digitally controlled oscillator, and a phase locked loop containing such a digitally controlled oscillator.

BACKGROUND OF THE INVENTION

Mobile radio systems today use various mobile radio standards such as Global System for Mobile communication, GSM, Enhanced Data Rates for GSM Evolution, EDGE, Universal Mobile Telecommunications Standard, UMTS, or others. In this case, radiofrequency signals are used for transmission.

Digitally controlled oscillators, DCOs, are increasingly being used to generate and receive the radiofrequency transmission/reception signals. A DCO generates a radiofrequency signal as an output signal on the basis of a digital frequency word. In addition, a digital phase locked loop comprising a DCO needs less space on a semiconductor body than a corresponding phase locked loop comprising an analog-controlled voltage controlled oscillator (VCO).

In mobile radio systems, DCOs operate not only as simple oscillators for generating local oscillator signals, but can also be used for direct modulation of baseband signals which are to be transmitted. FIG. 7 shows an exemplary embodiment of a conventional digitally controlled phase locked loop which is designed for two-point modulation. The phase locked loop comprises a digitally controlled oscillator DCO for generating an oscillator signal RFOut. The oscillator signal RFout is returned to a phase detector PD via a frequency divider MMT which has an adjustable divider ratio. The phase detector PD has a second input for receiving a reference frequency signal at a reference frequency Fref. The output of the phase detector PD is coupled to the input of the digitally controlled oscillator DCO via a digital loop filter LF and a summator S5. The second input of the summator S5 has a modulation device MOD1 connected to it which can be used to supply a modulation setting word $N_{mod}$ to the phase locked loop. The summator S5 is thus simultaneously a first modulation point MP1 of the phase locked loop.

A control input for setting the divider ratio of the frequency divider MMT forms the second modulation point MP2 of the phase locked loop. This input receives a sequence setting word $N_{seq}$ which is ascertained by means of a summator S7 from an integer channel setting word $N_{chan,int}$ and a sigma-delta modulated, fractional rational component. The component is provided by a sigma-delta modulator $\Sigma\Delta$. The sigma-delta modulator $\Sigma\Delta$ is supplied the modulation setting word $N_{mod}$ and a fractional channel setting word $N_{chan,frac}$ via the summator S6.

The modulation data represented by the modulation setting word $N_{mod}$ are thus supplied to the phase locked loop via the first modulation point MP1 and the second modulation point MP2. In this case, the supply via the second modulation point MP2 has a low-pass filter response, while the supply via the first modulation point MP1 and the first modulation device MOD1 has a high-pass filter response. In this context, it is necessary to know the gradient of the digitally controlled oscillator DCO, since otherwise the modulation signals can be adapted to the response characteristic of the open loop only with difficulty. The gradient of the oscillator DCO is expressed by a gradient factor $K_{DCO}$. The gradient factor $K_{DCO}$ indicates the effect which a change in the modulation setting word $N_{mod}$ has on the output frequency of the digitally controlled oscillator DCO, which can be expressed as follows on the basis of a frequency change $\Delta f$ and a change in the input word $\Delta y$ for the sigma-delta modulator $\Sigma\Delta$:

$$K_{DCO} = \frac{\Delta f}{\Delta y} \tag{1}$$

If the value of the gradient factor $K_{DCO}$ which is used in the modulation device MOD1 does not correspond to the real gradient of the digitally controlled oscillator DCO, inadmissible distortions in the modulated output signal from the oscillator DCO may arise. This increases the error vector magnitude, EVM.

FIG. 8 shows an example signal/time graph for output signals from a digitally controlled oscillator, where the frequency of the signals is plotted over time. Up to time t1, a first modulation setting word $N_{mod}1$ is supplied unchanged. At time t1, there is a switch to a second modulation setting word $N_{mod}2$, which is intended to prompt a sudden frequency change $\Delta F$. When the gradient factor $K_{DCO}$ is assumed to be at an optimum, there is a resultant ideal sudden change in the frequency of the output signal from the digitally controlled oscillator DCO by the frequency $\Delta F$, characterized by the solid line $K_{DCO}0$.

If the gradient factor $K_{DCO}$ is assumed to be too great, the phase locked loop locks more slowly up to the desired frequency of the output signal, characterized by the dashed line $K_{DCO}1$. If the value of the gradient factor $K_{DCO}$ is assumed to be too small, there is an overshot in the frequency of the output signal and subsequent locking onto the desired frequency from below, characterized by the dashed line $K_{DCO}2$. The lengthened transient process results in distortions in the output signal, particularly in the case of direct modulation, since the switch between various modulation setting words is sometimes very fast, which means that the desired output signal cannot be generated.

It may therefore be desirable to determine the gradient factor $K_{DCO}$ for modulating the phase locked loop as accurately as possible. The gradient of the digitally controlled oscillator DCO should also be able to be ascertained during operation, since it can change during operation—for example as a result of temperature-dependent drift processes. In the case of modulation methods operating on the basis of the Time Division mode Multiple Access TDMA, method, as in the case of GSM, for example, it is possible to ascertain the oscillator gradient in the transmission breaks between two data bursts, that is to say at times at which the oscillator signal is not primarily required. If, by contrast, a Code Division Multiple Access, CDMA, method is being used, as in the case of UMTS, for example, these breaks in which it is possible to ascertain the oscillator gradient are normally not available. In such systems performing continuous modulation in the phase locked loop, necessary determination of the gradient factor $K_{DCO}$ can be performed during operation only with difficulty and with a high level of complexity.

BRIEF DESCRIPTION OF THE DRAWINGS

The invention is explained in more detail below using a plurality of exemplary embodiments with reference to the figures.

In the figures:

FIG. 1 shows a first exemplary embodiment of an arrangement for determining a gradient factor, FIG. 2 shows a second exemplary embodiment of an arrangement for determining a gradient factor, FIG. 3 shows an exemplary embodiment of an identification device.

DETAILED DESCRIPTION OF THE INVENTION

Figure 4:
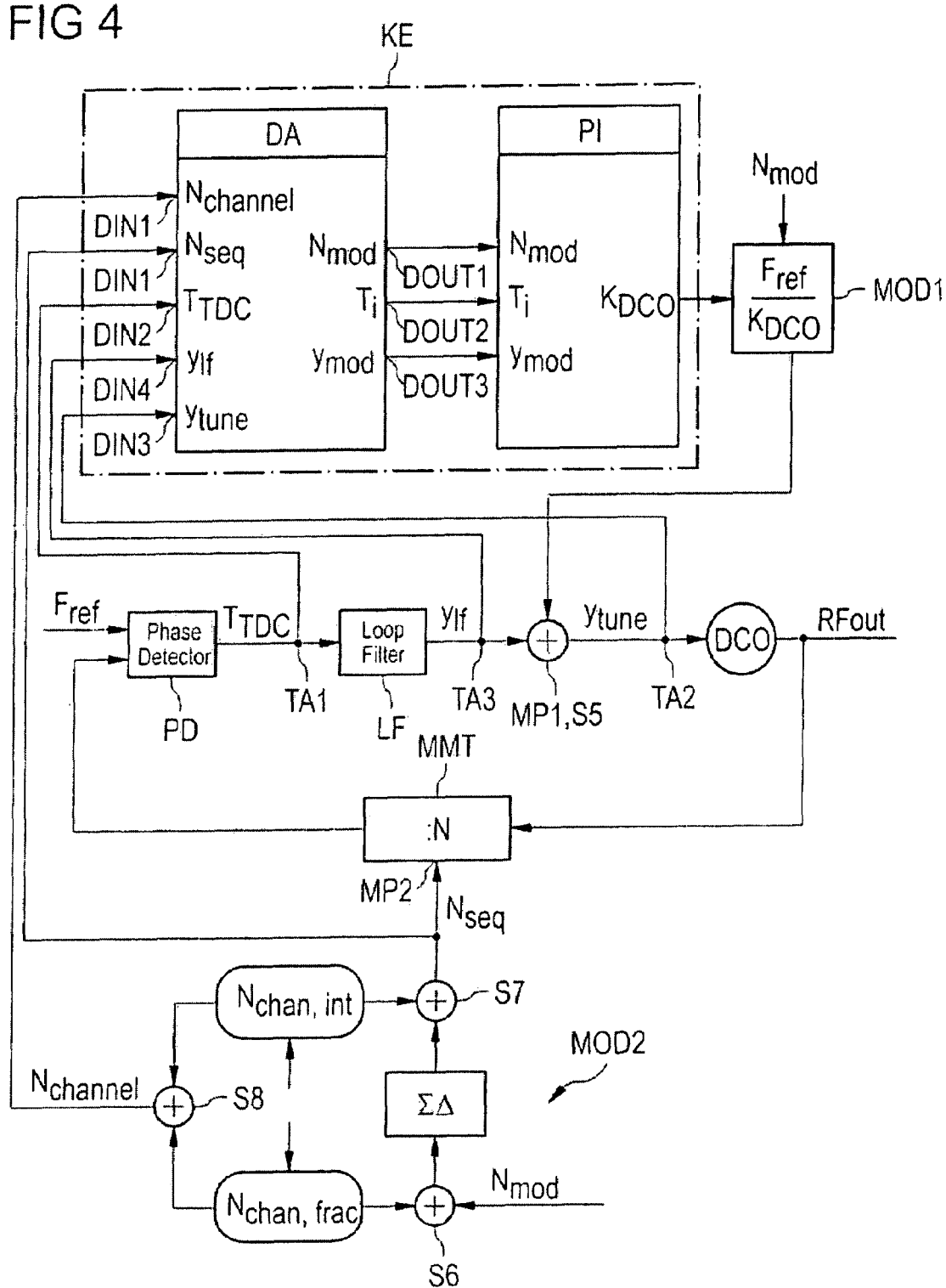
FIG. 4 shows a first exemplary embodiment of a phase locked loop.

In the following description further aspects and embodiments of the present invention are disclosed. In addition, reference is made to the accompanying drawings, which form a part hereof, and in which is shown by way of illustration, various examples in which the invention may be practiced. The embodiments of the drawings present a disclosure in order to provide a better understanding of one or more aspects of the present invention. This discussion is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

In one embodiment, an arrangement for determining a gradient factor for a digitally controlled oscillator comprises a data alignment device and an identification device. The data alignment device has a first input for receiving a modulation signal, a second input for receiving a phase error signal and a third input for receiving an oscillator control word. In addition, the data alignment device comprises a first output for outputting a modulation setting word on the basis of the modulation signal, a second output for outputting a time interval magnitude on the basis of the phase error signal and a reference interval, and a third output for outputting an oscillator modulation word on the basis of the oscillator control word. The identification device, whose input is coupled to the first, second and third outputs of the data alignment device, is provided for adaptation and outputting a gradient factor on the basis of the modulation setting word, the time interval magnitude and the oscillator modulation word.

The data alignment device can therefore condition the modulation signal, the phase error signal and the oscillator control word such that the magnitudes required for the identification device, namely the modulation setting word, the time interval magnitude and the oscillator modulation word, can be derived therefrom. The identification device relates these magnitudes to one another such that the optimum gradient factor for the digitally controlled oscillator can be ascertained therefrom.

In one embodiment the magnitudes supplied to the data alignment device can be tapped off from a digital phase locked loop during operation, or during a modulation process, for example. In line with one embodiment, ascertainment of the gradient factor for a digitally controlled oscillator is therefore possible easily and accurately even during operation.

In another exemplary embodiment an arrangement for determining a gradient factor for a digitally controlled oscillator comprises a data alignment device which has a first deviation apparatus for deriving a time interval magnitude on the basis of a phase error signal and a reference interval, and also a second deviation apparatus for deriving an oscillator modulation word on the basis of an oscillator control word. The arrangement also comprises an identification device for adaptation of the gradient factor on the basis of a modulation setting word, the time interval magnitude and the oscillator modulation word.

This embodiment also allows the gradient factor for the digitally controlled oscillator to be ascertained easily and accurately during operation.

FIG. 1 shows an exemplary embodiment of an arrangement KE for determining a gradient factor $K_{DCO}$. The arrangement comprises a data alignment device DA and an identification device PI. The data alignment device DA has a first input DIN1 for receiving a modulation setting word $N_{mod}$, and also a second input DIN2 for receiving a phase error signal $T_{TDC}$ and a third input DIN3 for receiving an oscillator control word $y_{tune}$. The data alignment device DA also has a first, a second and a third output DOUT1, DOUT2 and DOUT3 which are coupled to the identification device PI. The gradient factor $K_{DCO}$ is output at the output of the identification device PI.

Figure 7:
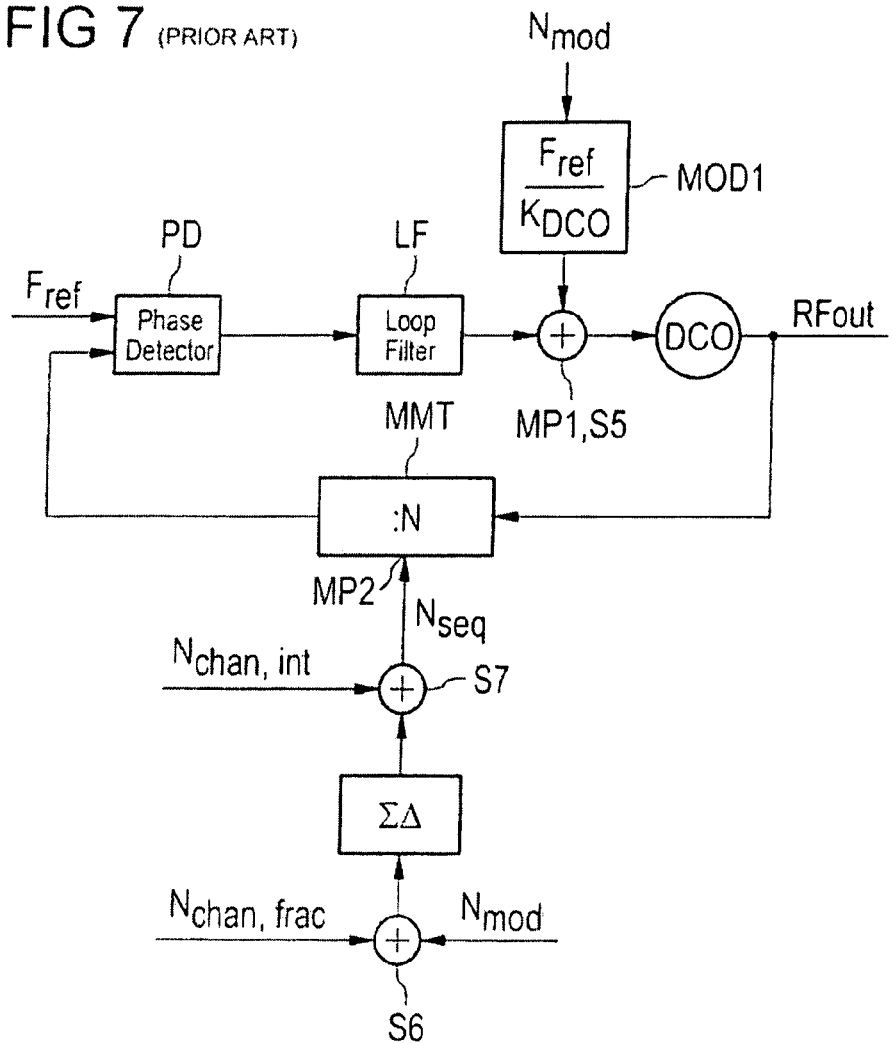
FIG. 7 shows an exemplary embodiment of a conventional phase locked loop.
Figure 8:
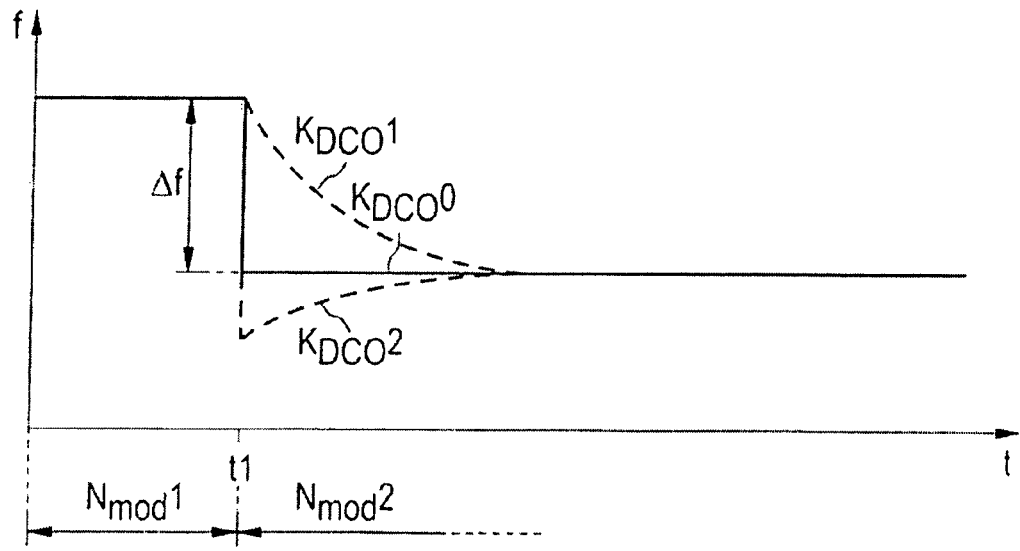
FIG. 8 shows an exemplary signal/time graph for oscillator signals.

The first output DOUT1 outputs the modulation setting word $N_{mod}$ unchanged. With reference to the phase locked loop shown in FIG. 7, the modulation setting word $N_{mod}$ represents the modulation data at the input of one or more modulation points of a digital phase locked loop. The phase error signal $T_{TDC}$ at the second input DIN2 can be tapped off as output signal from the digital phase detector PD, for example.

In a fully digital phase locked loop, the internal state magnitudes of the phase locked loop are in digital form at particular sampling times. These sampling times are overlaid by the quantization noise, whose stochastic response is largely known. A digital phase detector delivers a digital word for the time difference between a reference clock edge and a divider clock edge, that is to say the phase error signal $T_{TDC}$. This allows the output phase of the digitally controlled oscillator to be allocated time intervals which are in digital form. For the relationship between the change in the output phase of the digitally controlled oscillator $\Delta\Phi_{DCO,i}$ and an associated time interval magnitude $T_i$ at sampling time i, the following equations apply:

$$\Delta\Phi_{DCO,i}=2\cdot\pi\cdot N_{seq,i} \quad (2)$$

and $$T_i=T_{ref}-T_{TDC,i-1}+T_{TDC,i} \quad (3)$$

where $N_{seq,i}$ is an input signal for the frequency divider MMT in the return path. The time interval magnitude $T_i$ is the absolute time of the divider interval for the frequency divider MMT. $T_{ref}$ is the period duration of the reference frequency signal which is supplied to the phase detector PD. The magnitudes $T_{TDC,i}$ and $T_{TDC,i-1}$ are the phase error signal $T_{TDC}$ at two successive sampling times.

In the data alignment device DA in FIG. 1, the function of equation (3) is implemented by a delay element DL and a summator S2. In this case, the summator S2 is supplied the phase error signal in addition to the reference interval $T_{ref}$, once directly and once delayed and negated. The time interval magnitude $T_i$ is therefore formed or derived from a sum comprising the phase error signal $T_{TDC,i}$, a delayed negated value for the phase error signal $T_{TDC,i-1}$, and the reference interval $T_{ref}$. The summator S2 and the delay element DL are accordingly a first deviation apparatus for deriving the time interval magnitude $T_i$ on the basis of the phase error signal $T_{TDC}$ and the reference interval $T_{ref}$.

With respect of the oscillator control word $y_{tune}$ the following is obtained for the phase error $\Delta\Phi_{DCO}$ during a time interval $\Delta T$:

$$\Delta\Phi_{DCO} = 2 \cdot \pi \cdot \int_0^{\Delta T} (y_{tune} \cdot K_{DCO} + f_0) \cdot dt \quad (4)$$

Since the digital model of the digitally controlled oscillator has a discrete time basis, the input signal for the digitally controlled oscillator, that is to say the oscillator modulation word, can be assumed to be constant during the time interval $\Delta T$. The following is thus obtained:

$$\Delta\Phi_{DCO} = 2\cdot\pi\cdot(y_{tune}\cdot K_{DCO}+f_0)\cdot\Delta T \quad (5)$$

where $f_0$ is a base frequency acting as a constant frequency offset.

$\Delta\Phi_{DCO}$ describes the change in the phase of the oscillator on the basis of a constant channel frequency and a modulation frequency which changes over time. In this case, the change on the basis of the channel frequency can be represented by $$\Delta\Phi_{DCO,channel}=2\cdot\pi\cdot(y_{channel}\cdot K_{DCO}+f_0)\cdot\Delta T = 2\cdot\pi\cdot N_{channel}\cdot f_{ref}\cdot\Delta T \quad (6)$$

where $y_{channel}$ is the channel-dependent component of the oscillator control word $y_{tune}$ and $N_{channel}$ is the channel setting word. If the phase change on the basis of the constant channel frequency in accordance with equation (6) is now subtracted from equation (5), the result is:

$$\begin{aligned}\Delta\Phi_{DCO,mod} &= \Delta\Phi_{DCO} - \Delta\Phi_{DCO,channel} \quad (7)\\ &= 2\cdot\pi\cdot(y_{tune}\cdot K_{DCO}+f_0)\cdot\Delta T - \\ &\quad 2\cdot\pi\cdot(y_{channel}\cdot K_{DCO}+f_0)\cdot\Delta T\\ &= 2\cdot\pi\cdot(y_{tune}-y_{channel})\cdot\Delta T\cdot K_{DCO}\end{aligned}$$

Hence, equation (7) is also independent of the frequency offset $f_0$. However, the phase change $\Delta\Phi_{DCO,mod}$ on the basis of a modulation frequency which changes over time is dependent on the difference between the oscillator control word $y_{tune}$ and the channel-dependent component $y_{channel}$, said difference forming a modulation-dependent component in the form of an oscillator modulation word $y_{mod}$. This is shown in equation (8):

$$y_{mod}=y_{tune}-y_{channel} \quad (8)$$

The channel component $y_{channel}$ remains essentially constant over time, and it therefore represents a (time) average for the change in oscillator control word. Accordingly, the data alignment device in FIG. 1 forms the modulator modulation word $y_{mod}$ from a difference between the oscillator control word $y_{tune}$ at the third input DIN3 and a (time) average $y_{channel}$ for the oscillator control word $y_{tune}$. The second deviation apparatus provided is therefore a low-pass filter TP1, which forms the (time) average $y_{channel}$, and the summator S1, which performs the difference formation. The modulation setting word $N_{mod}$, the oscillator modulation word $y_{mod}$ and the time interval magnitude $T_i$ can then be used in the identification device PI for ascertaining the gradient factor $K_{DCO}$.

FIG. 2 shows another exemplary embodiment of an arrangement for determining the gradient factor $K_{DCO}$. As a departure from FIG. 1, the data alignment device DA is supplied the channel setting word $N_{channel}$ and the sequence setting word $N_{seq}$ at the first input DIN1. The summator S3 is used to generate the modulation setting word $N_{mod}$ from the difference between the sequence setting word $N_{seq}$ and the channel setting word $N_{channel}$. The summator S3 is therefore a third deviation apparatus for the modulation setting word $N_{mod}$.

In addition, the data alignment device DA has a fourth input DIN4 to which an oscillator base word $y_{1f}$ is applied. By way of example, the oscillator base word $y_{1f}$ can be tapped off at the output of the loop filter in the digital phase locked loop. In one embodiment the oscillator base word $y_{1f}$ corresponds essentially to the time average $y_{channel}$ and normally has only slight differences from this average. The low-pass filter TP2 can filter out these differences. In one alternative embodiment, the low-pass filter TP2 can be omitted and the oscillator base word $y_{1f}$ routed directly to the negative input of the summator S1. The (time) average for the oscillator base word $y_{1f}$ corresponds to the (time) average $y_{channel}$ for the oscillator base word $y_{tune}$.

By inserting equation (2) into equation (7), the following is obtained $$(y_{tune}-y_{channel})\cdot K_{DCO}\cdot\Delta T=N_{seq}\cdot f_{ref}\cdot N_{channel}\cdot\Delta T \quad (9)$$

In this case, the time interval $\Delta T$ corresponds to the time interval magnitude $T_i$, with the time difference $T_{quant}$ on account of quantization noise needing to be taken into account, so that the following is obtained for the time interval $\Delta T$:

$$\Delta T=T_i+T_{quant} \quad (10)$$

Inserted into equation (9), this results in $$(y_{tune}-y_{channel})\cdot K_{DCO}\cdot(T_i+T_{quant})=N_{seq}\cdot f_{ref}\cdot N_{channel}\cdot(T_i+T_{quant}) \quad (11)$$

This produces the following equation for the dependency of the modulation setting word $N_{mod,i}$ at time i $$N_{mod,i}=y_{mod,i}\cdot K_{DCO}\cdot T_i+e_i \quad (12)$$

where $e_i$ is an error which results from the quantized time interval. Rearrangement of equation (12) gives $$e_i=N_{mod,i}-y_{mod,i}\cdot K_{DCO}\cdot T_i \quad (13)$$

For an optimally determined gradient factor $K_{DCO}$, the value of the error $e_i$ changes to zero. It is then necessary to adapt the gradient factor $K_{DCO}$ such that this minimal error condition is met. The gradient factor $K_{DCO}$ can be adapted in one embodiment by minimizing the error signal $e_i$ using a method for minimizing the square errors. By way of example, this can be done using a least mean squares method or a recursive least squares method.

FIG. 3 shows an exemplary embodiment of an identification device PI as used in the arrangement shown in FIG. 1 or FIG. 2. The identification device PI comprises a multiplication device M1 to which the oscillator modulation word $y_{mod}$ and the time interval magnitude $T_i$ are supplied in order to multiply them by the current value of the gradient factor $K_{DCO}$. The result of the multiplication is compared with the modulation setting word $N_{mod}$ using a summator or a difference formation element S4. An error signal e is thus produced from the result from the multiplication device M1 and the modulation setting word $N_{mod}$. The error signal e is supplied to an adaptation device EST for adapting the gradient factor $K_{DCO}$. The adapted gradient factor $K_{DCO}$ can be tapped off at the output of the adaptation device EST so as to supply it to a modulation device in the phase locked loop, for example.

At the same time, the adapted gradient factor $K_{DCO}$ is updated in the multiplication device M1. The identification device PI therefore has a multiplication device M1 for multiplying the gradient factor $K_{DCO}$ by the oscillator modulation word $y_{mod}$ and the time interval magnitude $T_i$, a difference formation element S4 for generating an error signal e from a result from the multiplication device M1 and the modulation setting word $N_{mod}$, and an adaptation device EST for adapting the gradient factor $K_{DCO}$ on the basis of the error signal e, which minimize the error signal e using, in one embodiment, a method for minimizing the square errors. This can be done using a least mean squares method or a recursive least square method, in particular.

In one embodiment the data alignment device DA and the identification device PI can be implemented both using discrete components and to form an integrated circuit. In addition, it is possible to implement the function of the data alignment device and of the identification device in a digital signal processor or in another manner based on software.

Since only one parameter needs to be matched for the error minimization in equation (13), namely the gradient factor $K_{DCO}$, the arrangement for determining the gradient factor can be implemented with very little hardware complexity or little computation complexity. In addition, the arrangement is simple and accurate, since the measured variables which are supplied to the arrangement are in digital form in one embodiment.

In another exemplary embodiment a phase locked loop comprises an arrangement based on one of the exemplary embodiments described above and also the digitally controlled oscillator. The phase locked loop also has a first modulation device whose input can receive the modulation setting word and the gradient factor and whose output is connected to a first modulation point of the first control loop. In addition, a first tap, which is coupled to the arrangement for the purpose of receiving the phase error signal, and a second tap, which is coupled to the arrangement for the purpose of receiving the oscillator control word, are provided.

Hence, the phase locked loop can be supplied with the modulation setting word and with the gradient factor determined using the arrangement, the magnitudes which are required for determining the gradient factor also being able to be tapped off during operation of the phase locked loop. It is therefore possible to ensure fast and accurate modulation in the phase locked loop with a low value for the error vector. A phase locked loop based on one of the embodiments shown can be used both for single-point and two-point modulation, and a greater number of modulation points is not out of the question and thus contemplated by the invention.

FIG. 4 shows an exemplary embodiment of a phase locked loop comprising the arrangement KE for determining a gradient factor. As described previously for FIG. 7, the phase locked loop has a digitally controlled oscillator DCO and a return path comprising a controllable frequency divider MMT, a phase detector PD and a loop filter LF. The phase locked loop has a first tap TA1 at the output of the phase detector PD or at the input of the loop filter LF in order to provide the phase error signal $T_{TDC}$ for the data alignment device DA. In addition, a second tap TA2 is provided which allows the oscillator control word $y_{tune}$ to be tapped off at the input of the digitally controlled oscillator DCO. A third tap TA3 is used to output the oscillator base word $y_{1f}$. The first, second and third taps TA1, TA2, TA3 are coupled to the relevant inputs DIN2, DIN3, DIN4 of the data alignment device DA.

The first input DIN1 of the data alignment device DA is coupled to a second modulation device MOD2 in order to tap off the sequence setting word $N_{seq}$ and the channel setting word $N_{channel}$. In an alternative embodiment, the first input DIN1 can be supplied the modulation setting word $N_{mod}$ directly too, as shown in FIG. 1. The second modulation device MOD2 is supplied an integer component $N_{chan,int}$ and a fractional component $N_{chan,frac}$ of the channel setting word, these components forming the compiled channel setting word $N_{channel}$ via the summator. In addition, the second modulation device MOD2 is supplied the modulation setting word $N_{mod}$, which is added to the fractional component $N_{chan,frac}$ of the channel setting word by means of the summator S6. The result of this addition is modulated using a sigma-delta modulator $\Sigma\Delta$. In one embodiment the sigma-delta modulator $\Sigma\Delta$ may be in the form of a MASH modulator. The modulated data are added to the integer component $N_{chan,int}$ of the channel setting word by means of the summator S7, generating the sequence setting word $N_{seq}$. This is used to control the divider ratio of the frequency divider MMT. The input of the frequency divider MMT is therefore a second modulation point MP2.

The phase locked loop also comprises the first modulation device MOD1, whose input is supplied the modulation setting word $N_{mod}$ and, from the arrangement KE, the gradient factor $K_{DCO}$ and whose output is connected to a first modulation point MP1 of the phase locked loop, the first modulation point MP1 being formed by a summator S5. The modulation at the first modulation point MP1 is therefore effected by means of addition to the oscillator base word $y_{1f}$. In the exemplary embodiment of the phase locked loop, the first modulation device MOD1 has a factor $F_{ref}/K_{DCO}$ by which the modulation setting word $N_{mod}$ is multiplied. The modulation device MOD1 may also be referred to as a high-pass amplification device.

In the phase locked loop shown, estimation or adaptation of the gradient factor $K_{DCO}$ can also take place in modulation mode. This means that the arrangement KE and the phase locked loop are suitable both for TDMA systems and for CDMA systems. They can also be used in multimode modulation systems which use both a TDMA method and a CDMA method. There is therefore no time limit to certain time intervals in which the gradient factor $K_{DCO}$ can be ascertained.

Figure 5:
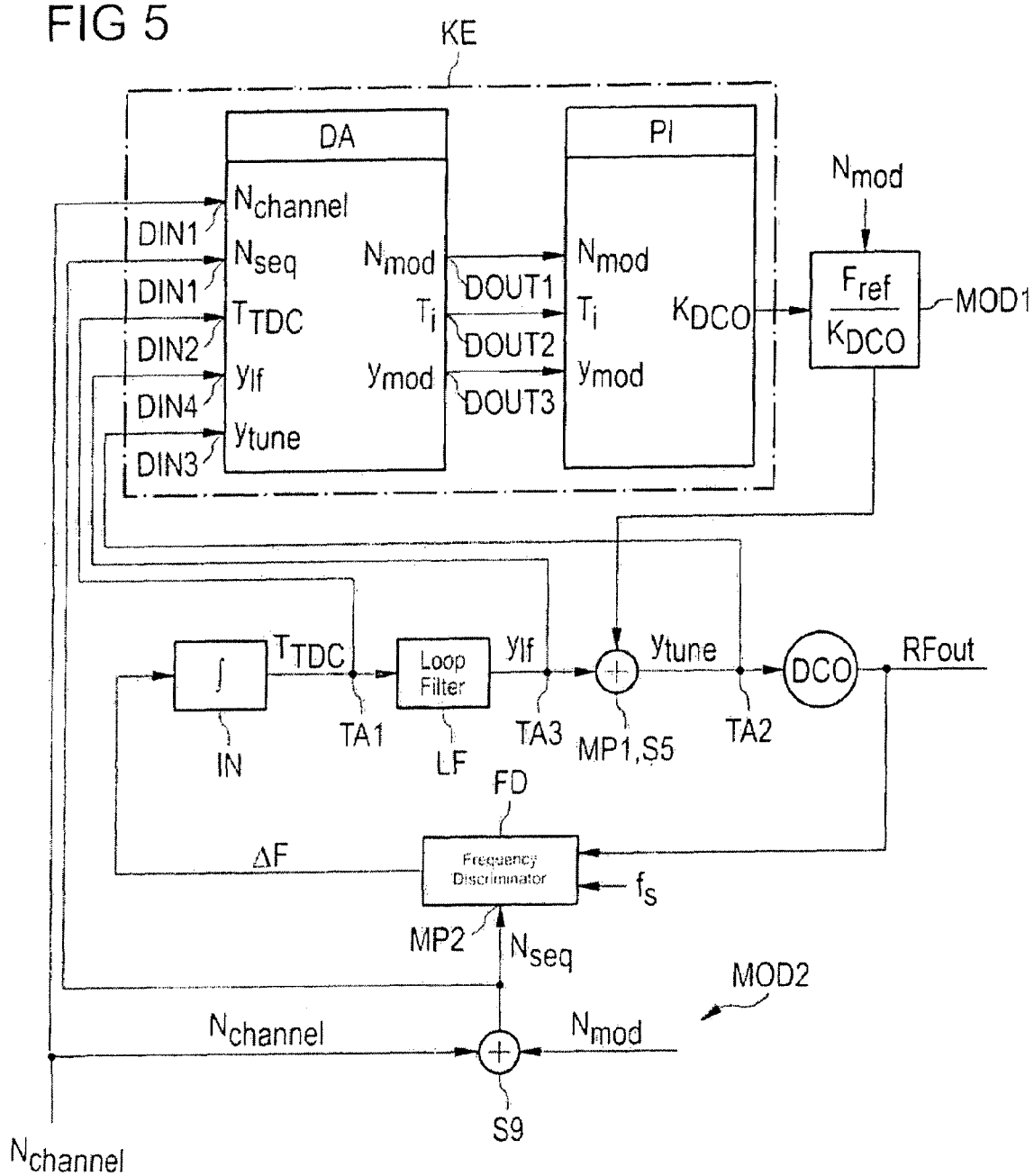
FIG. 5 shows a second exemplary embodiment of a phase locked loop.

FIG. 5 shows an alternative exemplary embodiment of a phase locked loop comprising an arrangement KE for determining the gradient factor for the digitally controlled oscillator DCO. For the arrangement KE, it is again possible to use embodiments as shown in FIGS. 1 to 3. The return path of the phase locked loop has a frequency discriminator FD which is supplied the output signal from the digitally controlled oscillator DCO and a comparison frequency signal $f_s$. The output of the frequency discriminator FD generates a signal $\Delta F$ which represents the frequency difference and which is supplied to an integrator IN. The result of the integration is the phase error signal $T_{TDC}$ which is output to the digital loop filter LF.

The first modulation device MOD1 with the first modulation point MP1 and also the taps TA1, TA2, TA3 correspond to the embodiment shown in FIG. 4. A second modulation device MOD2 comprises the summator 59 to which the channel setting word $N_{channel}$ and the modulation setting word $N_{mod}$ are supplied and which forms the sequence setting word $N_{seq}$ therefrom. In this context, the channel setting word $N_{channel}$ is supplied as a whole, that is to say without being split into fractional and integer components. A control input of the frequency discriminator FD forms the second modulation point MD2, which is supplied to the sequence setting word $N_{seq}$.

The embodiment shown in FIG. 5 is again a phase locked loop with two-point modulation, with modulation by means of the first modulation device MOD1 having a high-pass filter response, while the modulation by means of the second modulation device MOD2 exhibits a low-pass filter response. Again, there is the assurance that it is also possible to adapt the gradient factor $K_{DCO}$ during the operation or a modulation in the phase locked loop.

Figure 6:
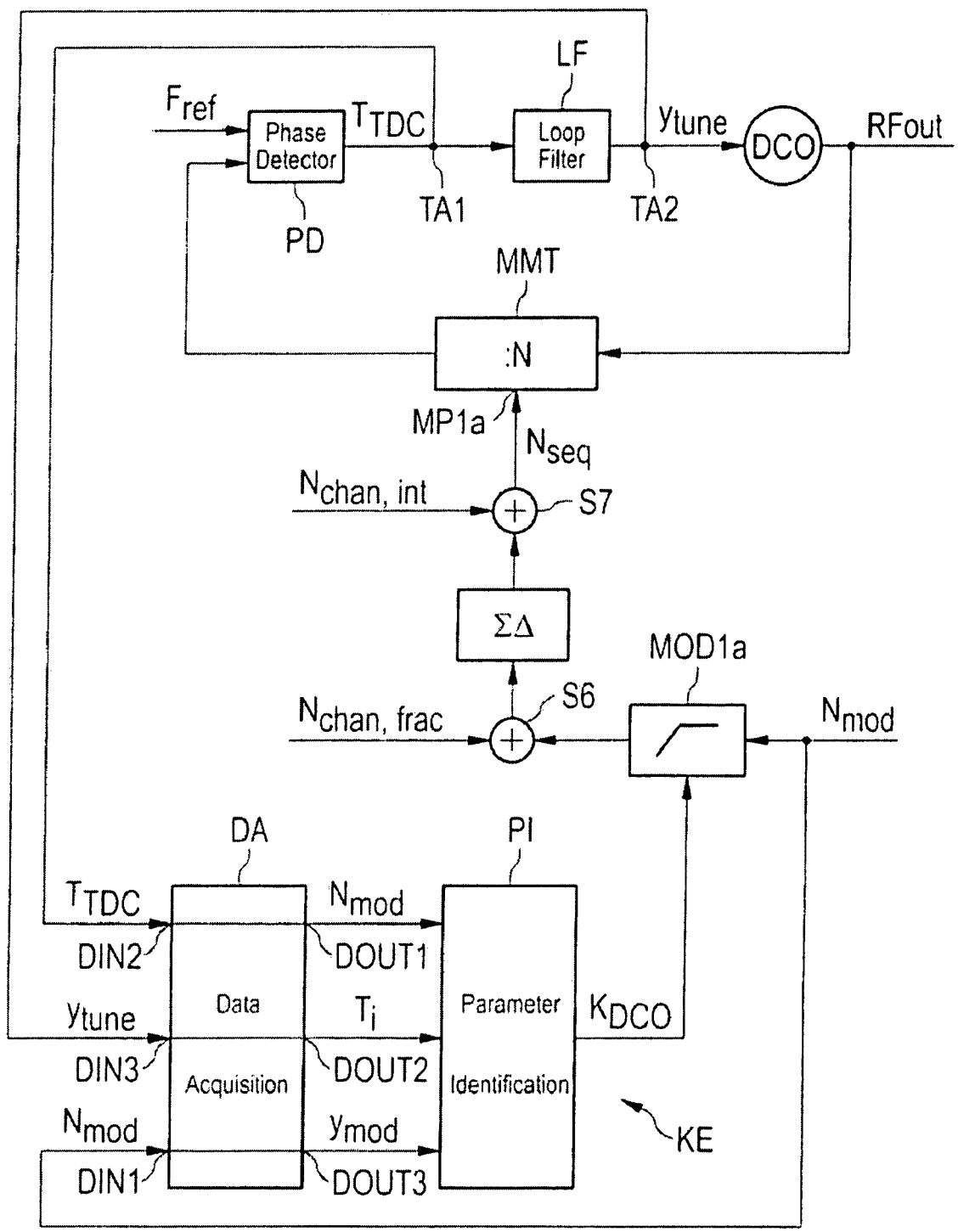
FIG. 6 shows a third exemplary embodiment of a phase locked loop.

FIG. 6 shows another exemplary embodiment of a phase locked loop comprising an arrangement for determining the gradient factor for the digitally controlled oscillator. The phase locked loop again has a digitally controlled oscillator DCO whose output signal is fed back via a return path comprising a frequency divider MMT, a phase detector PD and a loop filter LF. Modulation is effected by means of the first modulation device MOD1a, which is supplied the modulation setting word $N_{mod}$. The output of the modulation device MOD1a is, in a similar manner to that described for FIG. 4, connected via the summators S6 and S7 and the sigma-delta modulator $\Sigma\Delta$ to the first modulation point MP1a, which is in turn formed by the control input of the frequency divider MMT.

A first tap TA1 for the phase error signal $T_{TDC}$ is in turn arranged at the output of the phase detector PD or at the input of the loop filter LF and is connected to the second input DIN2 of the data alignment device. The first input DIN1 of the data alignment device DA is coupled to the input of the first modulation device MOD1a for the purpose of supplying the modulation setting word. Alternatively, the modulation setting word $N_{mod}$ could be supplied to the identification device PI directly. A second tap TA2 for the oscillator control word $y_{tune}$ is arranged at the input of the oscillator DCO and is coupled to the third input DIN3 of the data alignment device.

The return path of the phase locked loop comprising the frequency divider MMT has a low-pass filter response for the output signal from the first modulation device MOD1a. This low-pass filter response is compensated for by high-pass predistortion in the first modulation device MOD1a for the modulation setting word $N_{mod}$. In this context, the gradient factor $K_{DCO}$ is also included in the modulation.

In the exemplary embodiments shown, the gradient factor can be identified from the digital data using various methods of parameter identification, for example using the aforementioned minimization of the square errors or using maximum likelihood methods or other correlation methods. The methods for minimizing the square errors include, for example, least mean squares, least squares, recursive least squares, Kalman filtering or many other options available for them. The invention is not limited to the listed methods of parameter identification in any way, however.

The various embodiments shown can be used to determine the gradient factor accurately even under unfavorable conditions for the starting value of the gradient factor within a few clock periods, so that the modulation properties of a phase locked loop or of a phase locked loop comprising the arrangement permit distortion-free modulation.

By way of example, an arrangement KE can be used in a phase locked loop in a mobile radio or a mobile communication appliance. In this case, the arrangement is particularly suitable for appliances which support a plurality of mobile radio standards.

In one exemplary embodiment of a method for determining a gradient factor for a digitally controlled oscillator a phase error signal and an oscillator control word are detected. The phase error signal and a reference interval are taken as a basis for deriving a time interval magnitude. An oscillator modulation word is derived on the basis of the oscillator control word. The gradient factor is adapted on the basis of a modulation setting word, the time interval magnitude and the oscillator modulation word.

Since it is also possible to detect the phase error signal and the oscillator control word during operation of a phase locked loop, the gradient factor for the digitally controlled oscillator can be ascertained during continuous actuation of the oscillator.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. An arrangement for determining a gradient factor for a digitally controlled oscillator, comprising:
  a data alignment device comprising a first input configured to receive a modulation signal, a second input configured to receive a phase error signal, a third input configured to receive an oscillator control word, a first output configured to output a modulation setting word based on the modulation signal, a second output configured to output a time interval magnitude based on the phase error signal and a reference interval, and a third output configured to output an oscillator modulation word based on the oscillator control word; and
  an identification device comprising an input coupled to the first, second and third outputs of the data alignment device, and configured to adapt and output the gradient factor based on the modulation setting word, the time interval magnitude and the oscillator modulation word.

2. The arrangement of claim 1, wherein the data alignment device is supplied the modulation setting word as the modulation signal.

3. The arrangement of claim 1, wherein the modulation signal comprises a channel setting word and a sequence setting word, and wherein the data alignment device is configured to generate the modulation setting word from a difference between the sequence setting word and the channel setting word.

4. The arrangement of claim 1, wherein the data alignment device is configured to form the time interval magnitude from a sum comprising the phase error signal, a delayed and negative value of the phase error signal, and the reference interval.

5. The arrangement of claim 1, wherein the data alignment device configured to form the oscillator modulation word from a difference between the oscillator control word and a time average of the oscillator control word.

6. The arrangement of claim 5, wherein the time average is derived from an oscillator base word applied to a fourth input of the data alignment device.

7. The arrangement of claim 1, wherein the identification device comprises:
   a multiplication device configured to multiply the gradient factor by the oscillator modulation word and the time interval magnitude;
   a difference formation element configured to generate an error signal from a result from the multiplication device and the modulation setting word; and
   an adaptation device configured to adapt the gradient factor based on the error signal.

8. An arrangement for determining a gradient factor for a digitally controlled oscillator, comprising:
   a data alignment device comprising a first deviation apparatus configured to derive a time interval magnitude based on a phase error signal and a reference interval, and a second deviation apparatus configured to derive an oscillator modulation word based on an oscillator control word; and
   an identification device configured to adapt the gradient factor based on a modulation setting word, the time interval magnitude and the oscillator modulation word.

9. The arrangement of claim 8, wherein the data alignment device comprises a third deviation apparatus configured to derive the modulation setting word from a difference between a sequence setting word and a channel setting word.

10. The arrangement of claim 8, wherein the second deviation apparatus is configured to derive the oscillator modulation word by deriving the oscillator modulation word from a difference between the oscillator control word and a time average of the oscillator control word.

11. The arrangement of claim 8, wherein the identification device comprises:
    a multiplication device configured to multiply the gradient factor by the oscillator modulation word and the time interval magnitude;
    a difference formation element configured to generate an error signal from a result from the multiplication device and the modulation setting word; and
    an adaptation device configured to adapt the gradient factor based on the error signal, wherein the gradient factor is adapted to minimize the error signal using a method for minimizing the square errors comprising least mean squares or recursive least squares.

12. A phase locked loop, comprising:
    a data alignment device comprising a first input configured to receive a modulation signal, a second input configured to receive a phase error signal, a third input configured to receive an oscillator control word, a first output configured to output a modulation setting word based on the modulation signal, a second output configured to output a time interval magnitude based on the phase error signal and a reference interval, and a third output configured to output an oscillator modulation word based on the oscillator control word;
    an identification device comprising an input coupled to the first, second and third outputs of the data alignment device, and configured to adapt and output the gradient factor based on the modulation setting word, the time interval magnitude and the oscillator modulation word;
    a digitally controlled oscillator configured to generate an output signal based on the oscillator control word;
    a first modulation device comprising an input configured to receive the modulation setting word and the gradient factor and output a modified modulation setting word in response thereto at a first modulation point of the phase locked loop;
    a phase detector configured to output the phase error signal based on a comparison between a feedback signal and a reference frequency signal;
    a loop filter configured to generate the oscillator control word based on the phase error signal; and
    a divider circuit in a feedback path configured to controllably divide down the output signal to form the feedback signal based on a sequence setting word.

13. The phase locked loop of claim 12, wherein the first modulation device has a high-pass response for the modulation setting word, and wherein the first modulation point comprises an input of the divider circuit.

14. The phase locked loop of claim 12, wherein the first modulation point comprises a summator connected upstream of an input of the digitally controlled oscillator.

15. The phase locked loop of claim 14, further comprising a second modulation device configured to receive the modulation setting word, and comprising an output coupled to a second modulation point in the feedback path of the phase locked loop.

16. A phase locked loop, comprising:
    a data alignment device comprising a first deviation apparatus configured to derive a time interval magnitude based on a phase error signal and a reference interval, and a second deviation apparatus configured to derive an oscillator modulation word based on an oscillator control word; and
    an identification device configured to adapt a gradient factor based on a modulation setting word, the time interval magnitude and the oscillator modulation word;
    a digitally controlled oscillator configured to generate an output signal based on the oscillator control word;
    a first modulation device comprising an input configured to receive the modulation setting word and the gradient factor, and generate a modified modulation setting word at an output that is coupled to a first modulation point of the phase locked loop;
    a phase detector configured to output the phase error signal based on a comparison between a feedback path signal and a reference frequency signal;
    a loop filter configured to generate an oscillator base word based on the phase error signal; and
    a divider circuit configured to controllably divide down the output signal to form the feedback path signal based on a sequence setting word,
    wherein the first modulation point comprises a summing component configured to output the oscillator control word based on the oscillator base word and the modified modulation setting word.

17. The phase locked loop of claim 16, further comprising a second modulation device configured to provide the modified modulation setting word or a signal associated therewith to the divider circuit at a second modulation point.

18. A method for determining a gradient factor for a digitally controlled oscillator, comprising:
    detecting a phase error signal;
    detecting an oscillator control word;
    deriving a time interval magnitude based on the phase error signal and a reference interval; and deriving an oscillator modulation word based on the oscillator control word; and adapting the gradient factor from a previous value based on a modulation setting word, the time interval magnitude and the oscillator modulation word.

19. The method of claim 18, wherein the modulation setting word is derived from a difference between a sequence setting word and a channel setting word.

20. The method of claim 18, wherein the time interval magnitude is derived from a sum comprising the phase error signal, a delayed and negative value of the phase error signal, and the reference interval.

21. The method of claim 18, wherein the oscillator modulation word is derived from a difference between the oscillator control word and a time average of the oscillator control word.

22. The method of claim 21, wherein the time average is formed from an oscillator base word.

23. The method of claim 18, wherein the adaptation of the gradient factor comprises:

multiplying the gradient factor by the oscillator modulation word and the time interval magnitude;

generating an error signal by forming a difference between the multiplication result and the modulation setting word; and adapting the gradient factor based on the error signal.

24. The method of claim 23, wherein the adaptation is effected by minimizing the error signal using a method for minimizing the square errors.

25. The method of claim 24, wherein the method for minimizing the square errors comprises a least mean squares method or a recursive least squares method.

* * * * *